US 7,890,220 B2

(12) United States Patent
Chamberlain

(10) Patent No.: US 7,890,220 B2
(45) Date of Patent: Feb. 15, 2011

(54) LOW OVERHEAD CLOSED LOOP CONTROL SYSTEM

(75) Inventor: David Brian Chamberlain, Hooksett, NH (US)

(73) Assignee: MKS Instruments, Inc., Wilmington, MA (US)

( * ) Notice: Subject to any disclaimer, the term of this patent is extended or adjusted under 35 U.S.C. 154(b) by 1682 days.

(21) Appl. No.: 11/120,396

(22) Filed: May 3, 2005

(65) Prior Publication Data

US 2006/0249076 A1 Nov. 9, 2006

(51) Int. Cl.
G05D 16/00 (2006.01)
G06F 19/00 (2006.01)
F16K 31/36 (2006.01)
C23C 14/00 (2006.01)
B05C 11/00 (2006.01)
G05D 7/00 (2006.01)
G06F 11/00 (2006.01)
C23C 16/00 (2006.01)

(52) U.S. Cl. .............. 700/301; 700/108; 700/121; 700/282; 118/50; 118/695; 118/715; 137/188; 137/487.5

(58) Field of Classification Search .......... 700/282, 700/301, 108, 121; 137/487.5; 702/188; 118/50, 695, 715; 713/150, 178
See application file for complete search history.

(56) References Cited

U.S. PATENT DOCUMENTS

| | | | | |
|---|---|---|---|---|
| 4,007,754 A | * | 2/1977 | Beck et al. ..................... | 137/2 |
| 4,910,777 A | * | 3/1990 | Larson et al. ................ | 713/150 |
| 5,062,446 A | * | 11/1991 | Anderson .................. | 137/468 |
| 5,261,092 A | * | 11/1993 | McLaughlin et al. ........ | 713/375 |
| 5,303,302 A | * | 4/1994 | Burrows ..................... | 713/161 |
| 5,335,281 A | * | 8/1994 | Tugenberg et al. .......... | 709/209 |
| 5,583,755 A | * | 12/1996 | Ichikawa et al. ............. | 700/37 |
| 5,810,657 A | | 9/1998 | Pariseau et al. | |
| 5,828,851 A | * | 10/1998 | Nixon et al. ................ | 710/105 |
| 6,205,860 B1 | | 3/2001 | Hooper et al. | |
| 6,266,726 B1 | * | 7/2001 | Nixon et al. ................ | 710/105 |
| 6,313,584 B1 | * | 11/2001 | Johnson et al. ......... | 315/111.21 |
| 6,577,988 B1 | | 6/2003 | Travagline et al. | |
| 6,810,308 B2 | * | 10/2004 | Shajii et al. ................. | 700/282 |

(Continued)

OTHER PUBLICATIONS

European Patent Office, International Search Report for PCT/US2006/016888 mailed Aug. 28, 2006, 4 pages.

Primary Examiner—Albert Decady
Assistant Examiner—Thomas H Stevens
(74) Attorney, Agent, or Firm—Wilmer Cutler Pickering Hale & Dorr LLP.

(57) ABSTRACT

A tool includes a chamber, a network, a sensor, a tool controller, and a pressure controller. The network carries messages to and from devices on the network. A header portion of a message indicates a sender of the message and at least one intended recipient of the message. The sensor measures a pressure within the chamber. The sensor, tool controller, and pressure controller are on the network. The pressure controller controls the pressure within the chamber in response to measurements provided by the sensor and in response to a set point provided by the tool controller. The pressure controller processes header portions of all messages carried on the network to determine the intended recipients of each message and processes at least part of data portions of both messages intended for the pressure controller and at least some messages not intended for the pressure controller.

7 Claims, 4 Drawing Sheets

U.S. PATENT DOCUMENTS

| | | | |
|---|---|---|---|
| 6,813,534 B2 * | 11/2004 | Sui et al. | 700/121 |
| 6,966,967 B2 * | 11/2005 | Curry et al. | 156/345.26 |
| 6,986,046 B1 * | 1/2006 | Tuvell et al. | 713/171 |
| 7,171,001 B2 * | 1/2007 | Tuvell et al. | 380/278 |
| 7,243,371 B1 * | 7/2007 | Kasper et al. | 726/22 |
| 7,444,506 B1 * | 10/2008 | Datta et al. | 713/153 |
| 2002/0183885 A1 | 12/2002 | Goder et al. | |
| 2004/0037016 A1 * | 2/2004 | Kaneko et al. | 361/1 |
| 2005/0010317 A1 | 1/2005 | Hadar et al. | |
| 2005/0270173 A1 * | 12/2005 | Boaz | 340/870.02 |
| 2006/0036862 A1 * | 2/2006 | Tuvell et al. | 713/171 |
| 2008/0091306 A1 * | 4/2008 | Shajii et al. | 700/282 |

* cited by examiner

LOW OVERHEAD CLOSED LOOP CONTROL SYSTEM

BACKGROUND OF THE INVENTION

The present invention relates to control systems. More specifically, the present invention relates to communication between devices in a closed loop control system.

As is known in the art of semiconductor manufacturing, many of the steps used for producing integrated circuits are preformed within process chambers. The environment in such process chambers is typically rigorously controlled. For example, chemical vapor deposition (CVD) is performed by placing semiconductor wafers within a process chamber and then admitting selected gasses into the chamber while controlling the pressure and temperature within the chamber. Typically, the pressure in such chambers is very low (near vacuum) and the temperature is very high (several hundred degrees Celsius). As another example, in R.F. sputtering, in addition to controlling the pressure and temperature within the chamber, and in addition to controlling the gas content within the chamber, power is also selectively applied to electrodes within the chamber to carry out the desired R.F. sputtering process.

Tools for performing such processes (e.g., CVD and R.F. sputtering) typically include a tool controller that monitors and controls all of the parameters (e.g., pressure, temperature, power, gas content) relevant to the process. The tool controller also typically controls mechanical functions such as opening and closing doors, and moving wafers into and out of the process chamber. Such tools also typically use a sensor for measuring each of the relevant parameters (e.g., pressure, temperature) within the chamber and an actuator for adjusting the relevant parameters. Finally, such tools also typically use a specific controller for controlling, in response to instructions received from the tool controller, each of the relevant process parameters.

FIG. 1 shows a block diagram of such a prior art tool 100. Tool 100 is generally representative of a variety of tools used for the manufacture of semiconductors (e.g., the Applied Materials Producer SACVD). Tool 100 includes a process chamber 102 and a tool controller 110 for monitoring and controlling all of the parameters relevant to the process being performed within chamber 102. Tool 100 also includes a pressure sensor 122 (e.g., an MKS Baratron sensor) for monitoring the pressure within chamber 102, an actuator (e.g., a throttle valve) 124 for selectively adjusting the pressure within chamber 102, and a pressure controller 120 for controlling actuator 124 in response to information received from sensor 122 and instructions received from tool controller 110. Tool 100 typically also includes a variety of other sensors and actuators (e.g., thermistors, heaters) for monitoring and controlling other relevant parameters of the environment within chamber 102, but, for clarity, such other sensors and actuators are not shown in FIG. 1.

In operation, tool controller 110 generally provides a "set point" (e.g., 200 millitorr) to pressure controller 120. Then, using pressure measurements provided by pressure sensor 122 and the action of actuator 124, the pressure controller 120 endeavors to maintain the pressure within chamber 102 at the set point. Other than providing the desired set point to pressure controller 120, the tool controller 110 is generally not actively involved in pressure control. The tool controller 110 may be thought of as a "high level" controller that controls many parameters relevant to process chamber 102 (e.g., pressure, temperature, power, gas content, wafer location), whereas pressure controller 120 may be thought of as a "low level" controller that actively controls a single process parameter (i.e., pressure), by for example manipulating actuator 124. As indicated generally above, tool 100 typically includes several other low level controllers (not illustrated) for controlling other process parameters relevant to chamber 102.

As shown in FIG. 1, pressure controller 120 communicates with pressure sensor 122 and actuator 124 via analog lines 140 and 142, respectively. Also, tool controller 110 communicates with pressure controller 120 via line 150, which may be either an analog line or a digital line or bus. Many prior art tools use such analog lines (e.g., 140 and 142). Such analog lines are advantageously simple and inexpensive. However, they can also suffer from noise and poor dynamic range.

FIG. 2 shows another prior art tool 200. Tool 200 is very similar to tool 100 (FIG. 1) except the analog communication lines are replaced with digital busses. More specifically, like tool 100, tool 200 includes process chamber 102, tool controller 110, pressure controller 120, pressure sensor 122, and actuator 124 (as well as a variety of other controllers and actuators, which for clarity are not illustrated). However, tool 200 uses digital busses instead of analog lines for communication. Specifically, tool 200 includes a digital bus 240. Tool controller 110 connects to bus 240 via interface 248; pressure controller 120 connects to bus 240 via interface 244, pressure sensor 122 connects to bus 240 via interface 242, and actuator 124 connects to bus 240 via interface 246. Replacing the analog communication lines with digital busses advantageously provides enhanced noise immunity, improved dynamic range, and allows tool 200 to use newer models of devices (e.g., of pressure sensor 122) that provide digital rather than analog interfaces. However, as discussed below, despite the use of digital busses, communication in tool 200 is inefficient.

In tool 200, tool controller 110 normally regularly polls all sensors in the tool. That is, controller 110 normally sends periodic messages, via bus 240, to each sensor in tool 200, and these messages request the sensors to transmit their status, via bus 240, to tool controller 110. In this fashion, tool controller 110 receives regular updates of the current measurements of parameters provided by the sensors, such as pressure sensor 122, that monitor the environment of process chamber 102. Tool controller 110 uses the information received from the sensors, such as pressure sensor 122, to maintain a current "model", or "image", of the environment within process chamber 102. This model is normally maintained within memory (e.g., RAM) within the tool controller 110. The model maintained by tool controller 110 is then used to provide data, when necessary, to other components within tool 200. For example, controllers or CPUs (not shown) that control tool 200 at a higher level than tool controller 110 may request this data from tool controller 110. As another example, pressure controller 120 typically monitors the pressure within process chamber 102 by periodically requesting the current pressure measurement from tool controller 110. Tool controller 110 responds to these requests from pressure controller 120 by transmitting the most recent pressure measurement received from pressure sensor 122 (i.e., the pressure measurement that is currently stored in the model maintained by tool controller 110) to pressure controller 120.

In other words, pressure controller 120 typically does not receive information about the pressure within process chamber 102 directly from pressure sensor 122 and instead receives that information directly from tool controller 110. This method of transferring pressure measurements from pressure sensor 122 to pressure controller 120 indirectly via tool controller 110 works well, but it places an extra burden on tool controller 110. That is, in addition to performing its other tasks, tool controller 110 must periodically send messages to pressure controller 120 regarding measurements of pressure within process chamber 102.

Another method of transferring pressure measurements from pressure sensor 122 to pressure controller 120 is by "peer-to-peer" communication. In this method, pressure controller 120 periodically sends messages, via bus 240, to pressure sensor 122 requesting the pressure sensor 122 to send a message with its current pressure measurement, via bus 240, back to pressure controller 120. This type of peer-to-peer communication advantageously relieves tool controller 110 from the responsibility of transmitting pressure information to pressure controller 120. However, it disadvantageously requires bus 240 to carry extra messages, thereby increasing message traffic on the bus. In addition, messages (both requests and responses) between the pressure controller 120 and the pressure sensor 122 may be prevented from accessing the bus at known times due to other network activity. This can result in latency and non-determinism of the pressure feedback signal from the pressure sensor 120. It is well understood that the proper operation of a closed-loop control system must minimize latency and non-determinism to allow optimum control performance.

One popular form of communication protocol used in tools such as tool 200 that supports both the regular polling messages used by tool controller 110, and peer-to-peer messages between devices such as pressure controller 120 and pressure sensor 122, is called "DeviceNet". Background information regarding the design and operation of DeviceNet systems can be found, for example, in the literature available from the Open DeviceNet Vendors Association (ODVA). Briefly, DeviceNet messages generally contain a header and some data. The header includes the address of the sender of the message and the address of at least one intended recipient of the message. For example, a message from pressure sensor 122 to tool controller 110 would have a header specifying the DeviceNet address of pressure sensor 122 (as the message sender), the DeviceNet address of tool controller 110 (as the intended message recipient), and a data portion containing the current pressure measurement provided by sensor 122 and possibly other status information about sensor 122.

Devices (e.g., pressure controller 120) that are compatible with DeviceNet typically include a "controller area network" (CAN). A CAN is the basic hardware associated with a DeviceNet device. FIG. 3 shows a block diagram of tool 200 that is very similar to that of FIG. 2. However, in FIG. 3, the view of pressure controller 120 has been expanded to show that it includes a CAN 120A, and a local processor 120B. In reality, each of the devices in tool 200 (e.g., pressure sensor 122, actuator 124) also include their own CAN as well as other components (such as local processors), however, for clarity these other CANs are not shown in FIG. 3. One task performed by the CAN is examining the headers of all messages transferred on the communication bus (e.g., bus 240), and screening out messages not intended for the device. For example, the CAN 120A of pressure controller 120 examines the header of all messages on bus 240 and screens out all messages for which the address of the intended recipient is not pressure controller 120. That is, CAN 120A only passes messages along to local processor 120B when the pressure controller 120 is the intended recipient of the message. This allows the local processor 120B within pressure controller 120 to ignore most of the messages on bus 240 and permits local processor 120B to pay attention to, or respond to, only those messages that are actually intended for the pressure controller 120.

Because of the inefficiencies discussed above, there remains a need for improved communication with tools such as tool 200.

SUMMARY OF THE INVENTION

These and other objects are provided by an improved pressure controller. The improved pressure controller is able to "eavesdrop" on messages that are not directed to it (i.e., messages for which the pressure controller is not specified as an intended recipient). In this fashion, the pressure controller is able to obtain pressure measurements from a pressure sensor without having to request the measurements from a tool controller and without having to send messages to the pressure sensor.

In one aspect, the invention provides a tool, including a process chamber, a communications network, a pressure sensor, a tool controller, and a pressure controller. The communications network is configured to transmit messages to and from a plurality of devices coupled to the network. At least some of the messages include a header portion and a data portion. The header portion of a particular message indicates a sender of the particular message and at least one intended recipient of the particular message. The pressure sensor is configured to measure a pressure within the process chamber. The pressure sensor, tool controller, and pressure controller are all coupled to the communication network. The pressure controller is configured to control the pressure within the process chamber in response to measurements of the pressure within the process chamber provided by the pressure sensor and in response to a set point provided by the tool controller. The set point represents a desired pressure within the process chamber. The pressure controller includes a local message processor and a local control processor. The local message processor passes at least part of a data portion of a first set of messages and a second set of messages to the local control processor. Each message in the first set of messages has a header indicating the pressure controller as at least one of the intended recipients. At least some of the messages in the second set include headers that do not specify the pressure controller as one of the intended recipients.

Still other objects and advantages of the present invention will become readily apparent to those skilled in the art from the following detailed description wherein several embodiments are shown and described, simply by way of illustration of the best mode of the invention. As will be realized, the invention is capable of other and different embodiments, and its several details are capable of modifications in various respects, all without departing from the invention. Accordingly, the drawings and description are to be regarded as illustrative in nature, and not in a restrictive or limiting sense, with the scope of the application being indicated in the claims.

BRIEF DESCRIPTION OF THE FIGURES

For a fuller understanding of the nature and objects of the present invention, reference should be made to the following detailed description taken in connection with the accompanying drawings in which the same reference numerals are used to indicate the same or similar parts wherein.

DETAILED DESCRIPTION OF THE INVENTION

Figure 1:
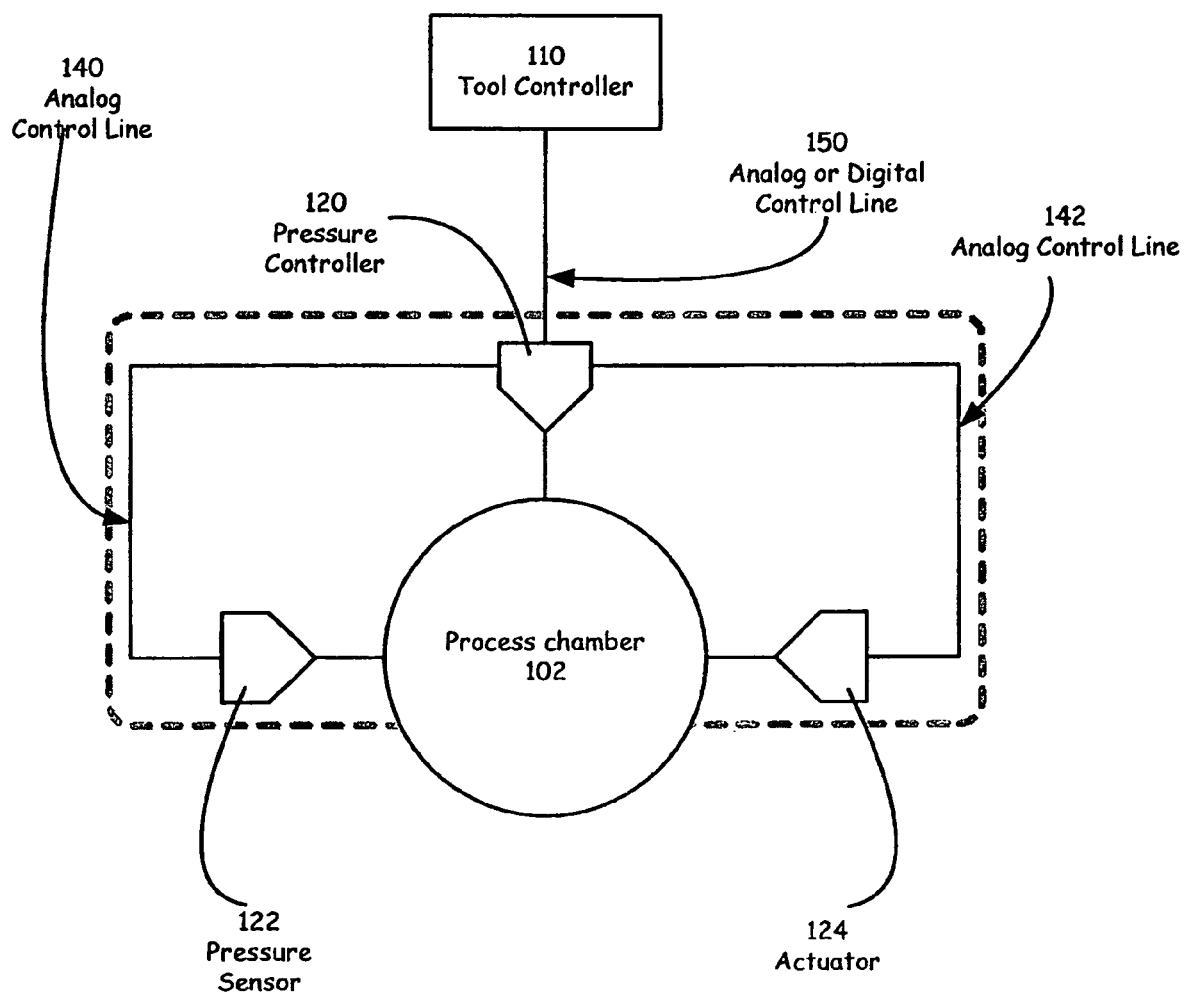
FIG. 1 shows a block diagram of a prior art semiconductor manufacturing tool.
Figure 2:
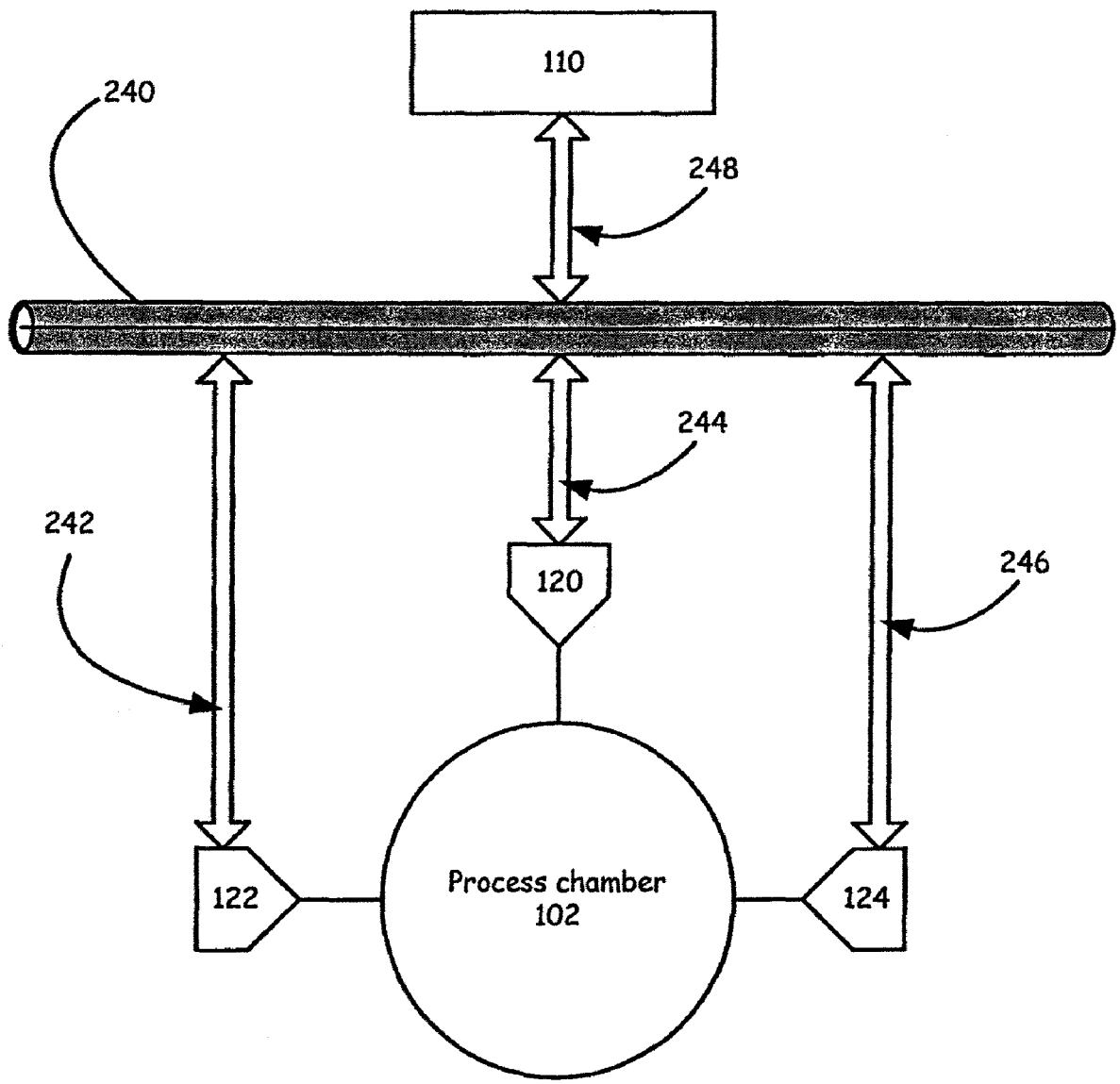
FIG. 2 shows a block diagram of another prior art semiconductor manufacturing tool.
Figure 3:
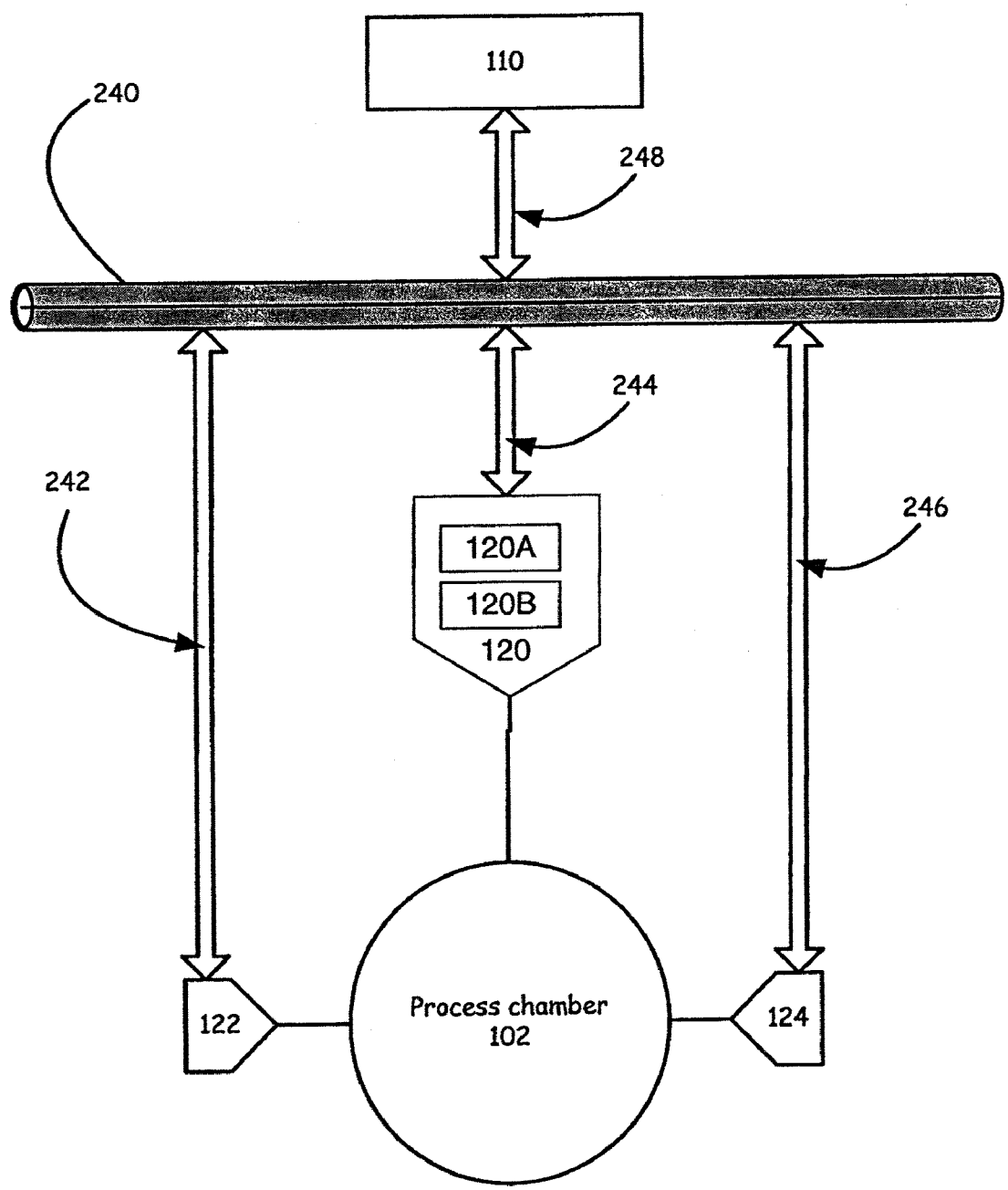
FIG. 3 shows a block diagram of the tool shown in FIG. 2, showing a more detailed view of the pressure controller.
Figure 4:
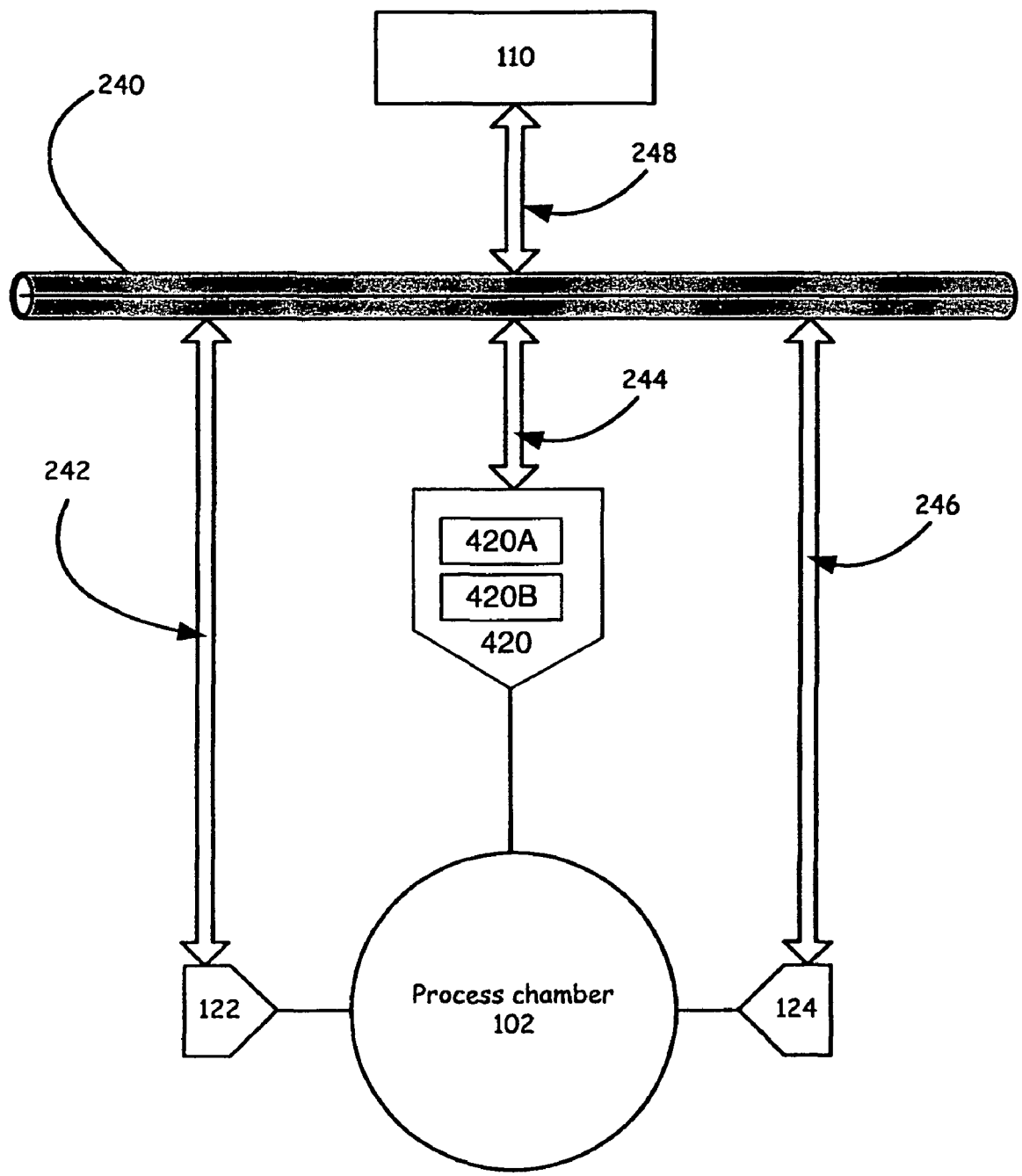
FIG. 4 shows a block diagram of a semiconductor manufacturing tool constructed in accordance with the invention.

FIG. 4 shows one embodiment of a tool 400 constructed according to the invention. As shown, tool 400 is similar to tool 200 (shown in FIGS. 2 and 3). However, instead of pressure controller 120, tool 400 includes improved pressure controller 420, and controller 420 includes improved CAN 420A and an improved local processor 420B. Like tool 200, tool 400 includes process chamber 102, tool controller 110, pressure sensor 122, actuator 124, as well as a variety of other sensors, actuators, and controllers that are, for clarity, not illustrated in FIG. 4. Tool 400 also includes digital bus 240. Tool controller 110, pressure sensor 122, pressure controller 420, and actuator 124 are all capable of sending and receiving messages via bus 240.

As discussed above in connection with tool 200 (FIG. 3), prior art CAN 120A prevented all messages from reaching the local processor 120B within pressure controller 120 unless pressure controller 120 was an intended recipient of the message. However, in tool 400, improved CAN 420A is configured to pass other messages to the local processor 420B within pressure controller 420. That is, CAN 420A passes messages onto local processor 420B when the address of the intended recipient is that of pressure controller 420, and CAN 420A also passes other messages to local processor 420B as well.

The goal of having CAN 420A pass other messages to local processor 420B is to allow pressure controller 420 to obtain pressure measurements from pressure sensor 122 (a) without having to request such information from tool controller 110 and (b) without having to send a message (e.g., a peer-to-peer message) to pressure sensor 122. One method of achieving this goal is to program CAN 420A to (a) pass all messages for which the intended recipient is pressure controller 420 to local processor 420B; (b) pass all messages for which the message sender is pressure sensor 122 to local processor 420B; and (c) to screen out all other messages. The messages described in sub-part (b) of the previous sentence are typically messages sent from pressure sensor 122 to tool controller 110 in response to a polling message sent from tool controller 110 to pressure sensor 122. Allowing local processor 420B to receive such messages is analogous to allowing pressure controller 420 to "eavesdrop" on messages that are of interest to pressure controller 420 but were not directed to pressure controller 420. Again, this allows pressure controller 420 to obtain pressure measurements from pressure sensor 122 without having to request such information from tool controller 110 and without sending special request messages to pressure sensor 122.

It will be appreciated that CAN 420A can be configured in other ways to achieve the goal of allowing local processor 420B to receive pressure measurements from pressure sensor 122 without having to request the measurements from tool controller 110 and without having to send messages directly to pressure sensor 122. For example, CAN 420A could alternatively be configured to pass all messages for which the intended recipient is tool controller 110 to local processor 420B. This method would pass messages from pressure sensor 122 along to local controller 420B, but it would also pass a variety of other messages to local controller 420B that re not relevant to pressure controller 420 (e.g., messages from temperature sensors). Another method of achieving the desired goal is to program CAN 420A to pass all messages to local controller 420B when the message sender is pressure sensor 122 and when the intended recipient is tool controller 110.

The invention has thus far been described in connection with a pressure controller. However, it will be appreciated that the invention can be used in connection with other types of controllers as well. For example, a temperature controller can be configured according to the invention to listen to messages intended for it as well as other messages (e.g., messages from a temperature sensor to a tool controller). Also, the invention has thus far been discussed within the context of a semiconductor manufacturing tool. However, it will be appreciated that the invention may be used in other contexts as well.

Since certain changes may be made in the above apparatus without departing from the scope of the invention herein involved, it is intended that all matter contained in the above description or shown in the accompanying drawing shall be interpreted in an illustrative and not a limiting sense.

What is claimed is:

1. A tool, including:
    a process chamber;
    a communication network configured to transmit messages to and from a plurality of devices coupled to the communication network, at least some of the messages including a header portion and a data portion, the header portion of a particular message indicating a sender of the particular message and at least one intended recipient of the particular message;
    a pressure sensor configured to measure a pressure within the process chamber, the pressure sensor being coupled to the communication network;
    a tool controller coupled to the communication network; and
    a pressure controller coupled to the communication network, the pressure controller configured to control the pressure within the process chamber in response to measurements of the pressure within the process chamber provided by the pressure sensor and in response to a set point provided by the tool controller, the set point representing a desired pressure within the process chamber, the pressure controller including a local message processor and a local control processor, the local message processor passing at least part of a data portion of a first set of messages and a second set of messages to the local control processor, each message in the first set of messages having a header indicating the pressure controller as at least one of the intended recipients, at least some of the messages in the second set including headers that do not specify the pressure controller as one of the intended recipients.

2. A tool according to claim 1, each message in the second set of messages indicating the pressure sensor as a sender of each said message in the second set of messages.

3. A tool according to claim 1, each message in the second set of messages indicating the tool controller as an intended recipient.

4. A tool according to claim 1, further including an actuator for selectively altering the pressure within the process chamber.

5. A tool according to claim 4, the actuator being coupled to the communication network.

6. A tool according to claim 5, the pressure controller controlling the pressure within the process chamber by sending messages to the actuator.

7. A tool according to claim 1, the tool controller providing the set point to the pressure controller by sending a message to the pressure controller.

\* \* \* \* \*